United States Patent
Stanculescu et al.

(10) Patent No.: US 10,490,995 B2
(45) Date of Patent: Nov. 26, 2019

(54) CURRENT DEPENDENT THERMAL SHUTDOWN

(71) Applicant: Infineon Technologies AG, Neubiberg (DE)

(72) Inventors: Sergiu Stanculescu, Cluj-Napoca (RO); Alexandru Simion, Bucharest (RO)

(73) Assignee: INFINEON TECHNOLOGIES AG, Neubiberg (DE)

( * ) Notice: Subject to any disclaimer, the term of this patent is extended or adjusted under 35 U.S.C. 154(b) by 169 days.

(21) Appl. No.: 15/674,545

(22) Filed: Aug. 11, 2017

(65) Prior Publication Data

US 2019/0052073 A1 Feb. 14, 2019

(51) Int. Cl.
| H02H 3/08 | (2006.01) |
| G01R 19/165 | (2006.01) |
| G05B 9/02 | (2006.01) |
| H02H 1/00 | (2006.01) |
| G01K 3/00 | (2006.01) |

(52) U.S. Cl.
CPC ............. *H02H 3/08* (2013.01); *G01K 3/005* (2013.01); *G01R 19/165* (2013.01); *G05B 9/02* (2013.01); *H02H 1/0007* (2013.01)

(58) Field of Classification Search
CPC ...... H02H 3/08; H02H 1/0007; G01R 19/165; G05B 9/02; G01K 3/005
USPC .......................................................... 307/131
See application file for complete search history.

(56) References Cited

U.S. PATENT DOCUMENTS

2017/0244240 A1* 8/2017 Watanabe .............. H02H 7/205

* cited by examiner

*Primary Examiner* — Hal Kaplan
(74) *Attorney, Agent, or Firm* — Slater Matsil, LLP

(57) ABSTRACT

According to an example, a device comprises a pass element and a controller. The controller is configured to receive a measurement of a current through the pass element. Based on the measurement of the current, the controller is configured to select a thermal shutdown threshold. The controller is further configured to turn off the pass element based on a determination that a temperature of the pass element is greater than the thermal shutdown threshold.

22 Claims, 12 Drawing Sheets

CURRENT DEPENDENT THERMAL SHUTDOWN

TECHNICAL FIELD

This disclosure relates in general to electronic power devices and particularly to electronic power devices including thermal shutdown protection.

BACKGROUND

Electronic devices sometimes include multiple channels, each of which may include a power stage that dissipates significant amounts of heat. The dissipated heat may cause the temperature of the power stage to rise to a level that may damage the power stage. A power stage that is conducting current above a threshold may be damaged at a lower temperature than a power stage conducting current below the threshold. In the case of devices with multiple channels, the temperature of a power stage may rise due to heat dissipated by neighboring channels, although the power stage is operating at a current level that does not present a risk of damaging the power stage due to self-heating.

SUMMARY

According to an example, a device includes a first pass element and a controller. The controller is configured to receive a measurement of a current through the first pass element. Based on the measurement of the current, the controller is further configured to select a thermal shutdown threshold. The controller is further configured to turn off the first pass element based on a determination that a first temperature of the first pass element is greater than the thermal shutdown threshold.

According to another example, a device includes a pass element and a controller arranged to receive a measurement of a current through the pass element. The controller includes means for selecting, based on the measurement of the current, a thermal shutdown threshold; and means for turning off the pass element based on a determination that a temperature of the pass element is greater than the thermal shutdown threshold.

According to another example, a method includes turning on a pass element. The method further includes selecting a thermal shutdown threshold to turn off the pass element at a first temperature threshold. The method further includes measuring a current through the pass element; and switching the thermal shutdown threshold to a second temperature threshold, based on the measurement of the current through the pass element.

DETAILED DESCRIPTION

With reference to the Figures, a device includes at least one channel for supplying power to a load. The channel includes a power stage and a controller. The power stage includes a pass element. The controller is configured to shut off the pass element based on a determination that a temperature of the pass element rises above a thermal shutdown threshold TSD. The determination that the temperature rises above the thermal shutdown threshold TSD is based on a temperature measurement. The controller adjusts the thermal shutdown threshold TSD based on a current level of the pass element or an estimated power dissipation of the pass element.

Figure 1:
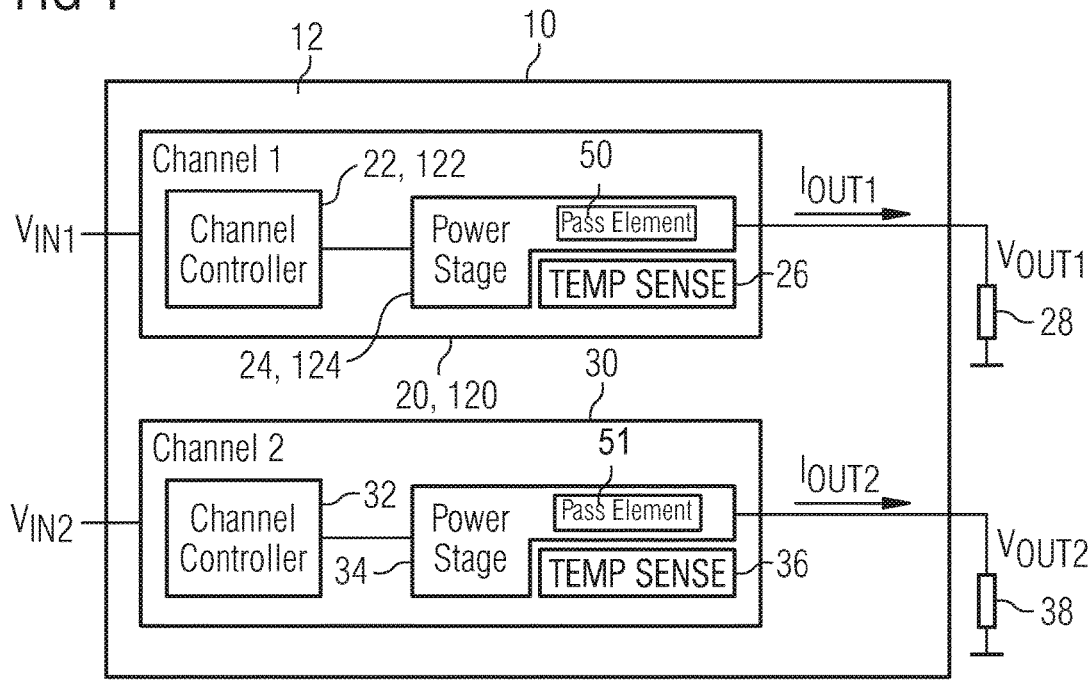
FIG. 1 is a diagram of an example device including two output channels.

FIG. 1 illustrates an example device 10 that includes a substrate 12, a first channel 20, 120 and a second channel 30. The first channel 20, 120 includes a channel controller 22, 122, a power stage 24, 124 and a first temperature sensor 26. In a first example, the first channel 20 and the channel controller 22 adjust the thermal shutdown threshold TSD based on current level. In a second example, the first channel 120 and the channel controller 122 adjust the thermal shutdown threshold TSD based on estimated power level. The first channel 20, 120 and the second channel 30 are on the substrate 12. "On the substrate," as used herein, means that the electronic components, transistors, resistors, capacitors, etc., forming the circuits and subcircuits of the first channel 20, 120 and second channel 30 are formed into and/or on one or more surfaces of the substrate 12. In an example, the device 10 is an integrated circuit formed on a silicon substrate or other type of semiconductor substrate. As another example, the device 10 may include one or more channels including electronic components formed, for example, on a ceramic substrate, or another electrically insulating material.

The first channel 20, 120 may be configured to receive power from a first node $V_{IN1}$ coupled to an input of the first channel 20, 120 and deliver power to a second node $V_{OUT1}$ coupled to an output of the first channel 20, 120. The second node $V_{OUT1}$ may supply a load device 28. An output current $I_{OUT1}$ may flow out of the power stage 24, 124 via the second node $V_{OUT1}$ to the load device 28.

The second channel 30 includes a channel controller 32, a power stage 34 and a second temperature sensor 36. The second channel 30 may be configured to receive power from a third node $V_{IN2}$ coupled to an input of the second channel 30 and deliver power to a fourth node $V_{OUT2}$ coupled to an output of the second channel 30. The fourth node $V_{OUT2}$ may supply a load device 38. An output current $I_{OUT2}$ may flow out of the power stage 34 via the fourth node $V_{OUT2}$ to the load device 38.

In an example device 10, the second channel 30 may be the same as or similar to the first channel 20, 120. That is, each of the channel controller 32, the power stage 34 and the second temperature sensor 36 may be the same as or similar to, respectively, the channel controller 22, 122, the power stage 24, 124 and the first temperature sensor 26 of the first channel 20. For the purposes of this disclosure, the term "the same" may be understood to encompass slight variations such as variations due to manufacturing tolerances wherein the functionality of the device remains within specified limits.

As described in additional detail below, the power stage 24, 124 in the first channel 20, 120 includes a first pass element 50. The power stage 34 in the second channel 30 may include a second pass element 51. The first temperature sensor 26 for the first channel 20, 120 may be a first predetermined distance from the first pass element 50 in the power stage 24, 124, and arranged to output a measurement of a temperature to the channel controller 22, 122. The second temperature sensor 36 for the second channel 30 may be a second predetermined distance from the second pass element 51 in the power stage 34 and arranged to output a measurement of a temperature to the channel controller 32. In an example, the first predetermined distance may be the same as the second predetermined distance such that differences in the thermal shutdown performance between the first channel 20, 120 and the second channel 30 are minimized. As described in additional detail below, the first and second predetermined distances may be small, for example 50 micrometers or less in the case the substrate 12 is a silicon substrate. In this case, the temperature measurements from the first and second temperature sensors 26, 36 provide indications respectively of the temperatures of the first channel 20, 120 and second channel 30.

In other examples of the device 10, the second channel 30 may be different from the first channel 20, 120. For example, the second pass element 51 may be larger than or smaller than the first pass element 50 of the power stage 24, 124. Further, the second channel 30 may or may not include thermal shutdown protection. The second channel 30 includes the second pass element 51 or another element that can dissipate sufficient heat under certain operating conditions to potentially heat neighboring channels such as the first channel 20, 120.

Figure 2:
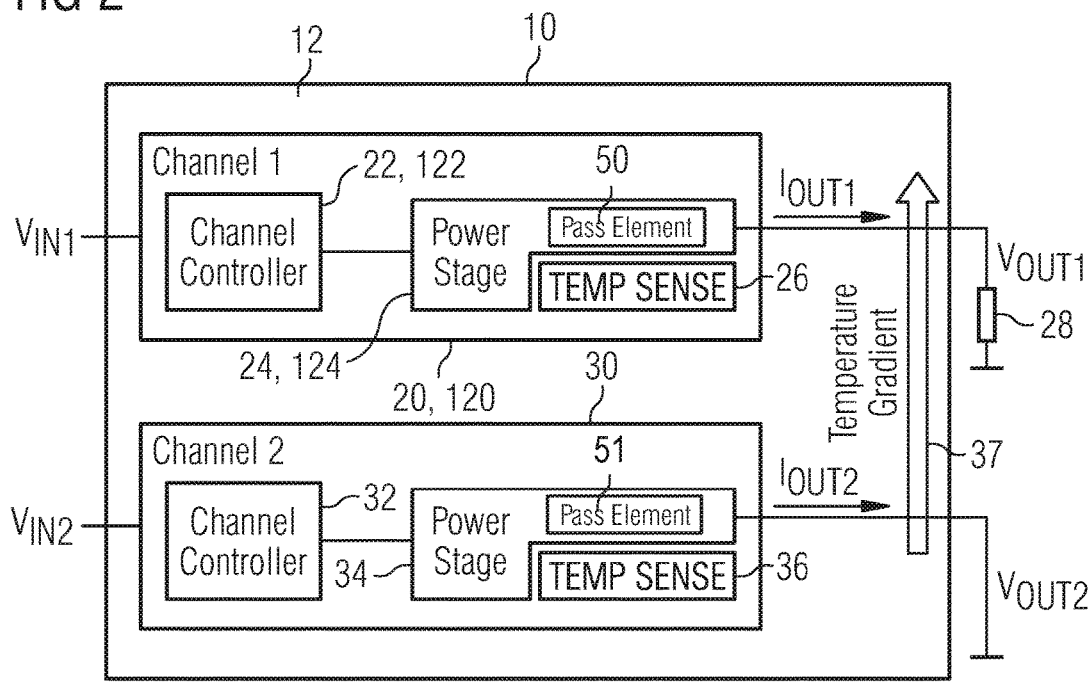
FIG. 2 is a diagram of the example device of FIG. 1 illustrating a thermal gradient due to a shorted output.

In a device such as the device 10 with multiple channels, heat dissipated by one or more other channels may increase the temperature of the first channel 20, 120. In the example device 10 as shown in FIG. 2, the fourth node $V_{OUT2}$ coupled to the output of the second channel 30 is shorted to ground. The dissipated heat from the power stage 34 of the second channel 30 may cause a thermal gradient 37 in the substrate 12.

The thermal gradient 37 may increase the temperature of the substrate 12 at the location of the first temperature sensor 26 associated with the first channel 20, 120. In some cases, the increased temperature of the substrate 12 at the location of the first temperature sensor 26 may result in a thermal shutdown of power stage 24, 124 of the first channel 20, 120, even though the first channel 20, 120 is operating in an allowed region. The "allowed region" is defined for the purposes of this document to mean an operating region where it is determined that a temperature of the first channel 20, 120 will not exceed a specified thermal limit due to self-heating.

One condition which may lead to heat from the second channel 30 triggering a thermal shutdown in the first channel 20, 120 is a mismatch between the second temperature sensor 36 for the second channel 30 and the first temperature sensor 26 for the first channel 20, 120.

For example, the thermal shutdown temperature for each of the first channel 20, 120 and the second channel 30 may be specified to be within a range of 160° C. to 175° C. Due to variations between the first channel 20, 120 and second channel 30, resulting, for example, from manufacturing tolerances, the actual thermal shutdown temperature for the first channel 20, 120 may be at a low end of the range at 160° C. and the actual thermal shutdown temperature for the second channel 30 may be at a high end of the range at 175° C. Due to the thermal gradient 37, as shown in FIG. 2, the first temperature sensor 26 may be heated to 160° C. before the second temperature sensor 36 is heated to 175° C. This may result in shutting off the first channel 20, 120 although it is operating in the allowed region. In the case that the load device 28 is a module or device configured to perform a function, for example an electronic module in an automobile such as a window control module configured to open and close a window, shutting off the first channel 20, 120 may result in losing the functionality provided by the module or device, although there is no fault condition present in the first channel 20, 120.

In order to avoid this situation, the thermal shutdown threshold TSD of the first channel 20, 120 may be adjusted from a first temperature level to a second, higher temperature level in the case that the power stage 24, 124 is operating at a current level or at a power level below a predetermined threshold. The difference between the first temperature level and the second temperature level may be based on the specified maximum mismatch error between the first temperature sensor 26 in the first channel 20, 120 and the second temperature sensor 36 in the second channel 30.

For example, as discussed above, the thermal shutdown threshold TSD for protection against self-heating for the first channel 20, 120 and the second channel 30 may be specified to be within a range from 160° C. to 175° C. In this case, the specified maximum mismatch error may be the difference between the low end of the range (160° C.) and the high end of the range (175° C.) equals 15 Celsius degrees. In order to prevent the first channel 20, 120 from shutting off due to a thermal shutdown condition caused by heat dissipated from the second channel 30, the thermal shutdown threshold TSD for the first channel 20, 120 may be increased nominally by 15 Celsius degrees, or perhaps a slightly larger value, for example 16 Celsius degrees, to account for any additional tolerances introduced by adjusting the thermal shutdown threshold TSD.

As another example, the difference between the first temperature level and the second temperature level may be set to be somewhat smaller than the specified maximum mismatch error. For example, if the maximum mismatch error is 15 Celsius degrees as above, but it is known that there will be a 5 Celsius degree drop along the thermal gradient 37 between the second channel 30 and the first channel 20, 120, then the difference in the first temperature level and the second temperature level could be set to be equal to the maximum mismatch error minus the thermal drop along the thermal gradient which equals, in this case 10 Celsius degrees.

Figure 3:
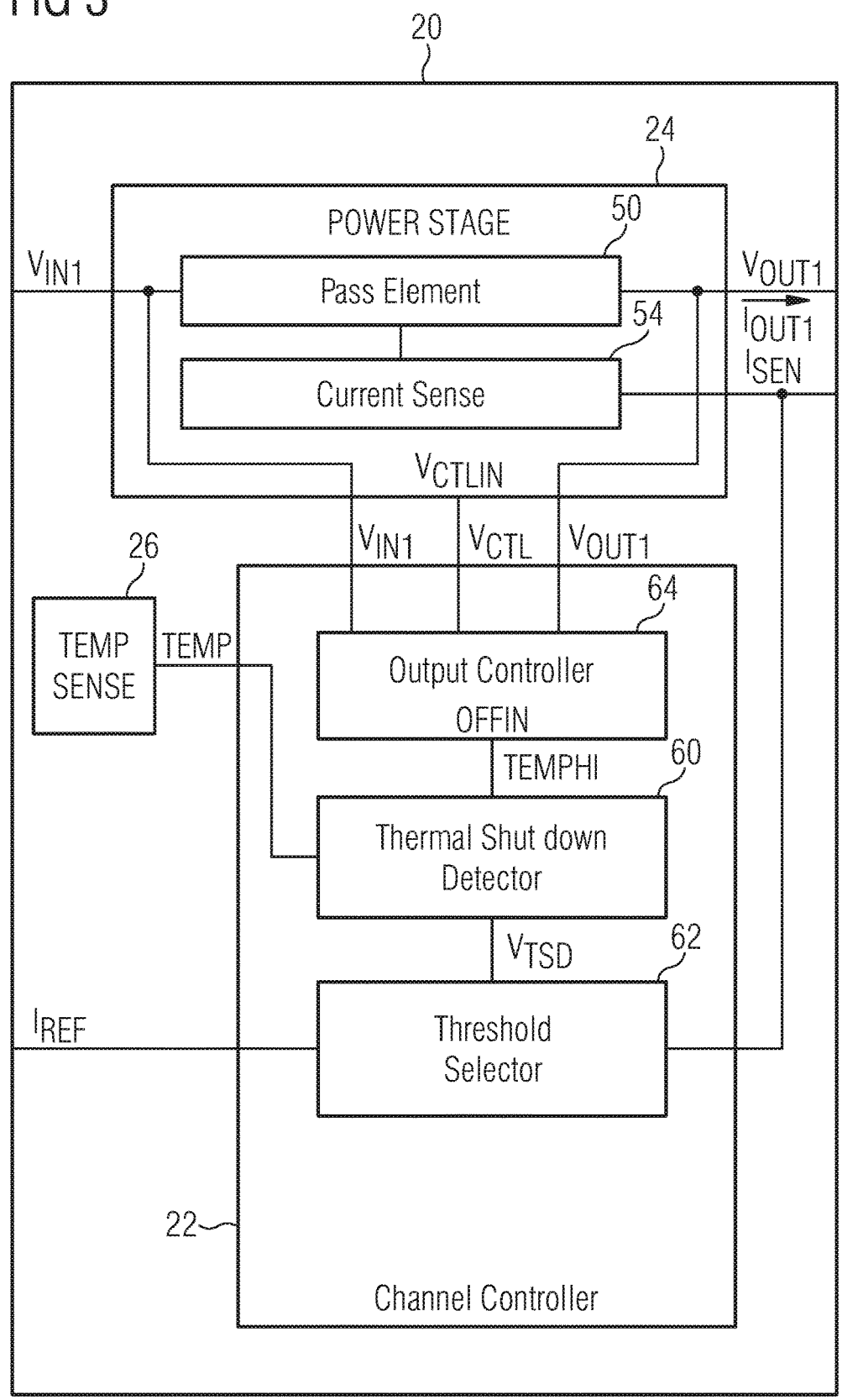
FIG. 3 is a block diagram of a first example channel that adjusts a thermal shutdown threshold based on a current level.

FIG. 3 is a block diagram of the first channel 20 configured to adjust the thermal shutdown threshold TSD based on a current $I_{OUT1}$ through the power stage 24. The first channel 20 is configured to receive power via the input coupled to the first node $V_{IN1}$ and supply power to the load device 28 (FIG. 1) via the output coupled to the second node $V_{OUT1}$. The first channel 20 includes the channel controller 22, the power stage 24 and the first temperature sensor 26.

The channel controller 22 includes a thermal shutdown detector 60, a threshold selector 62, and an output controller 64, and is configured to control the power stage 24. The channel controller 22 is configured to turn off the first pass element 50 in the power stage 24 based on a determination that the temperature of the power stage 24, as indicated by a measurement of the temperature TEMP, is greater than the thermal shutdown threshold TSD. The thermal shutdown threshold TSD is selected based on a measurement $I_{SEN}$ of the current $I_{OUT1}$ through the first pass element 50.

In an example channel controller 22, the threshold selector 62 is configured to receive the measurement $I_{SEN}$ from the power stage 24 representing the current $I_{OUT1}$ through the first pass element 50. Based on the measurement $I_{SEN}$, the threshold selector 62 generates a signal $V_{TSD}$ for the thermal shutdown detector 60. The signal $V_{TSD}$ is a signal representing the thermal shutdown threshold TSD. The measurement $I_{SEN}$ may be a current or voltage representing the current $I_{OUT1}$ through the first pass element 50.

As an example, the threshold selector 62 may be configured to select the thermal shutdown threshold TSD from the first temperature level for the measurement $I_{SEN}$ greater than or equal to a predetermined current threshold $I_{REF}$, and a second temperature level for the measurement $I_{SEN}$ less than the predetermined current threshold $I_{REF}$.

The threshold selector 62 may receive the measurement $I_{SEN}$ as a first input, and receive the predetermined current threshold $I_{REF}$ as a second input. The threshold selector 62 may compare the measurement $I_{SEN}$ with the predetermined current threshold $I_{REF}$, and based on the comparison, select the thermal shutdown threshold TSD.

In the case that the measurement $I_{SEN}$ is greater than or equal to the predetermined current threshold $I_{REF}$, the threshold selector 62 may select the first temperature level to be the thermal shutdown threshold TSD. The first temperature level may be a thermal shutdown threshold TSD for protection against self-heating for the first channel 20. Otherwise, the threshold selector 62 may select the second temperature level to be the thermal shutdown threshold TSD. The second temperature level may be the thermal shutdown threshold TSD adjusted to reduce the likelihood of shutting of the first channel 20 due to heating from the second channel 30, although the first channel 20 is operating in the allowed region.

In the example above, the first temperature level may be lower than the second temperature level. In this case, determining that the measurement $I_{SEN}$ is greater than the predetermined current threshold $I_{REF}$ may result in setting the lower, first temperature level.

Alternatively, determining that the measurement $I_{SEN}$ is below the predetermined current threshold $I_{REF}$ would result in setting the thermal shutdown threshold TSD to the higher, second temperature level.

The predetermined current threshold $I_{REF}$ may be determined based on a maximum allowable current $I_{MAX}$ for which the first pass element 50 can heat to a temperature greater than or equal to a specified thermal limit due to self-heating.

As an example:
A specified thermal limit $TL_{SH}$ due to self-heating may be 175° C.
A maximum ambient temperature $T_{AMBMAX}$ may be 125° C.
The thermal resistance $R_{th}$ of a package encompassing a device including the first channel 20, 120 may be 167K/W for a 1sOp board, footprint only.
The maximum voltage drop $V_{dr}$ of the device may be 40V.

With this set of conditions, the maximum allowable current $I_{MAX}$ may be calculated according to Eqn. 1 below:

$$(I_{MAX})(V_{dr})(R_{th})+T_{AMBMAX}=TL_{SH} \qquad \text{Eqn. 1}$$

In the example above, this results in the maximum allowable current $I_{MAX}$=7.5 mA.

Based on the range of the maximum allowable current $I_{MAX}$, the predetermined current threshold $I_{REF}$ may be determined to be a fraction of the maximum allowable current $I_{MAX}$. For example, for the case of $I_{MAX}$=7.5 mA, $I_{REF}$ may be set to be approximately $1/75^{th}$ of $I_{MAX}$. That is, $I_{REF}$ may be set to be equal to $I_{MAX}/75+/-x$, where x is a tolerance included to allow for inaccuracies in generating $I_{REF}$, expressed as a percentage of $I_{MAX}/75$. For a typical system, x might be in the range of 1 to 10%.

The thermal shutdown detector 60 is a subcircuit configured to receive a temperature measurement TEMP of the temperature of the first pass element 50 and compare the temperature measurement TEMP to the signal $V_{TSD}$, representing the thermal shutdown threshold TSD. Based on the comparison, the thermal shutdown detector 60 outputs a signal indicating whether the temperature measurement TEMP exceeds the signal $V_{TSD}$.

The output controller 64 is generally configured to provide a control signal $V_{CTL}$ that turns the power stage 24 on in the case the power stage 24 is activated, and turns the power stage 24 off in the case that a thermal shutdown condition is detected or the power stage 24 is not activated.

The power stage 24 includes the first pass element 50 and a current sense 54. The first pass element 50 is configured to receive power at an input coupled to the first node $V_{IN1}$ and supply the current $I_{OUT1}$ at an output coupled to the second node $V_{OUT1}$. The first pass element 50 may be controlled by the control signal $V_{CTL}$ received at a control input $V_{CTLIN}$ that switches the first pass element 50 between an on state and an off state.

Typically, the control signal $V_{CTL}$ received at the control input $V_{CTLIN}$ controls the amount of power delivered to the second node $V_{OUT1}$ the first pass element 50. The first pass element 50 may be configured to be a simple switch, turning the output coupled to the second node $V_{OUT1}$ on and off based on the control signal $V_{CTL}$. Alternatively, the first pass element 50 may be configured to deliver a regulated voltage or regulated current on the output coupled to the second node $V_{OUT1}$. Still further, the first pass element 50 may be controlled to provide a pulsed voltage or pulsed current at the output coupled to the second node $V_{OUT1}$. For example, the pulsed voltage or current may be pulse width modulated (PWM).

The current sense 54 is a subcircuit configured to measure the current through the first pass element 50 and provide the measurement $I_{SEN}$ to the threshold selector 62 in the channel controller 22. For example, current sense 54 may be configured to generate the measurement $I_{SEN}$ to be a fraction of the current $I_{OUT1}$, such as $1/75^{th}$. More specifically, the measurement $I_{SEN}$ may be set to be equal to $I_{OUT1}/75+/-y$, where y is a tolerance included to allow for inaccuracies in measuring the current $I_{OUT1}$. For a typical system, y might be in the range of 1 to 10%. In this case, for a current $I_{OUT1}$=7.5 mA, the measurement $I_{SEN}$ would be approximately equal to 100 µA.

The first temperature sensor 26 is a subcircuit configured to measure a temperature and output the temperature measurement TEMP. Typically, the first temperature sensor 26 is located within the first predetermined distance of the first pass element 50 such that the temperature measurement TEMP is an indication of the temperature of the first pass element 50. The first predetermined distance may depend on the technology used to manufacture the first pass element 50. For example, for the first pass element 50 manufactured as an integrated device on a silicon substrate, the first predetermined distance may be 50 micrometers.

As discussed herein, for ease of understanding, the temperature measurement TEMP increases with increasing temperature, and the signal $V_{TSD}$ representing the thermal shutdown threshold TSD increases with increasing thermal shutdown temperature. Actual circuit realizations may differ. For example, the temperature measurement TEMP may be a voltage that decreases with increasing temperature. In order to accommodate this, the signal $V_{TSD}$ representing the thermal shutdown threshold TSD may be generated to decrease as the thermal shutdown temperature increases.

Figure 4:
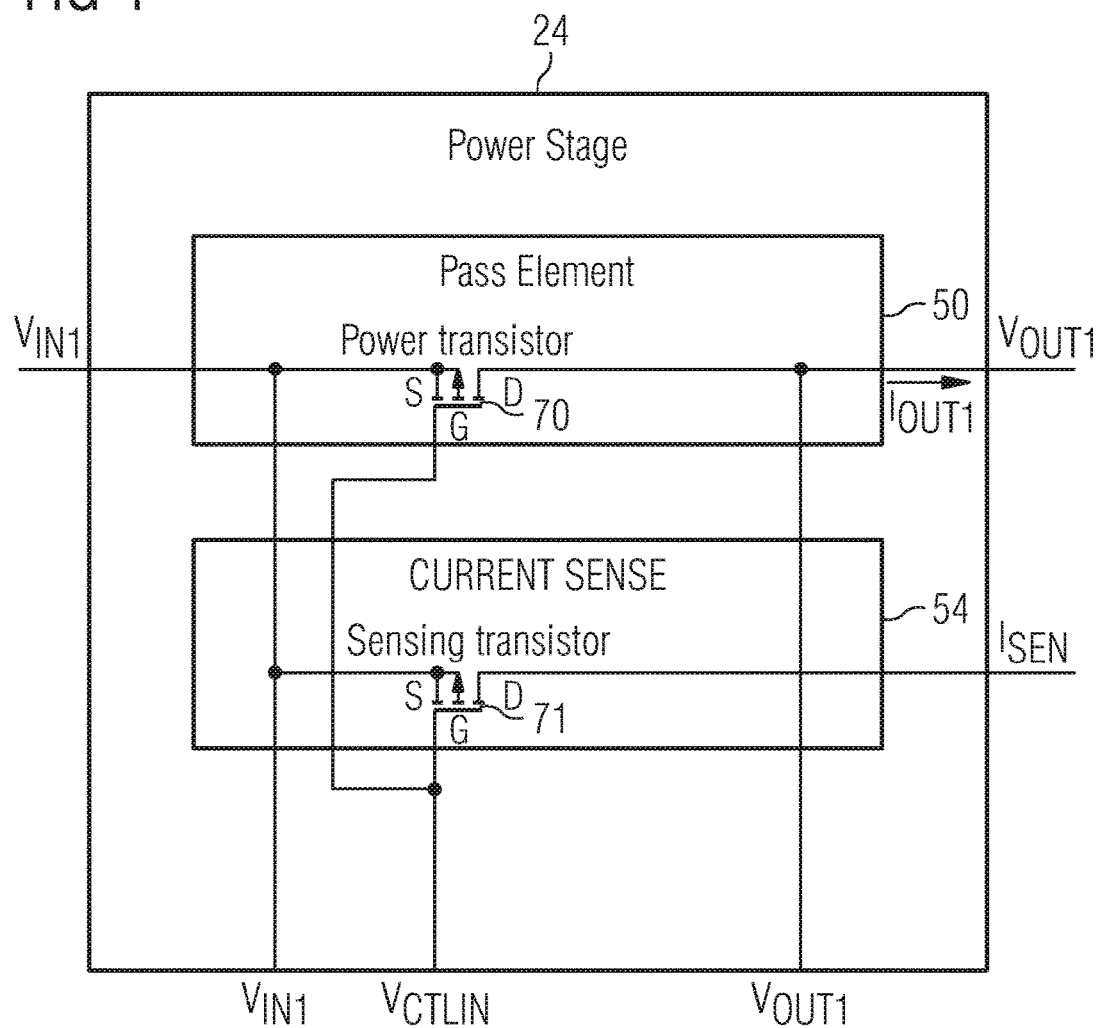
FIG. 4 is a block diagram of an example power stage.

FIG. 4 is a schematic diagram of an example power stage 24 including an example first pass element 50 and an example current sense 54. The example first pass element 50 includes a power transistor 70. The power transistor 70 is a p-channel enhancement mode metal oxide semiconductor transistor (p-channel transistor) and may include a source (S), a gate (G) and a drain (D). The power transistor 70 receives power at a first terminal coupled to the first node $V_{IN1}$ and delivers power to a second terminal coupled to the second node $V_{OUT1}$. The control input $V_{CTLIN}$ is coupled to the gate (G) of the power transistor 70. A signal received at the control input $V_{CTLIN}$ controls the power transistor 70.

Additionally or alternatively, the first pass element 50 may include other types of power elements. For example, the first pass element 50 may include one or more n-channel MOS transistors, one or more PNP transistors, one or more NPN transistors, one or more IGBTs, or any other type of power switching device.

The current sense 54 may include a sensing transistor 71. The sensing transistor 71 may also be a p-channel enhancement mode metal oxide semiconductor transistor (p-channel transistor) and may include a source (S), a gate (G) and a drain (D). It may be dimensioned to produce, under the same operating conditions as the power transistor 70, a fraction of the current $I_{OUT1}$ of the power transistor 70, for example, $1/75^{th}$ the current $I_{OUT1}$ of the power transistor 70. Another fraction can be chosen, depending on a specified range of the current $I_{OUT1}$ of the power transistor 70.

As shown in FIG. 4, the sensing transistor 71 and the power transistor 70 may be configured to operate under the same, or nearly the same operating conditions. For example, the source of the power transistor 70 may be coupled to the source of the sensing transistor 71 and the gate of the power transistor 70 may be coupled to the gate of the sensing transistor 71. In some cases, a voltage at the drain of the sensing transistor 71 may also be maintained to be substantially the same as a voltage at the drain of the power transistor 70. "Substantially the same as the voltage," as used herein, may be, for example, within +/−20 mV of the voltage, or within a range such that the tolerance y for measuring $I_{OUT1}$ remains within a specified range, for example from zero to 10%. The drain of the power transistor 70 may output the current $I_{OUT1}$, and the drain of the sensing transistor 71 may output the measurement $I_{SEN}$. The ratio between the current $I_{OUT1}$ through the first pass element 50 and the measurement $I_{SEN}$ may be established by the relative dimensioning of the power transistor 70 and the sensing transistor 71.

As another example, the current sense 54 may include a low impedance resistor, for example in a range of 10 mOhms to 1 Ohm in series with the first pass element 50. A voltage/current (V/I) converter may sense a voltage across the resistor and generate the measurement $I_{SEN}$ based on the voltage across the resistor.

Figure 5:
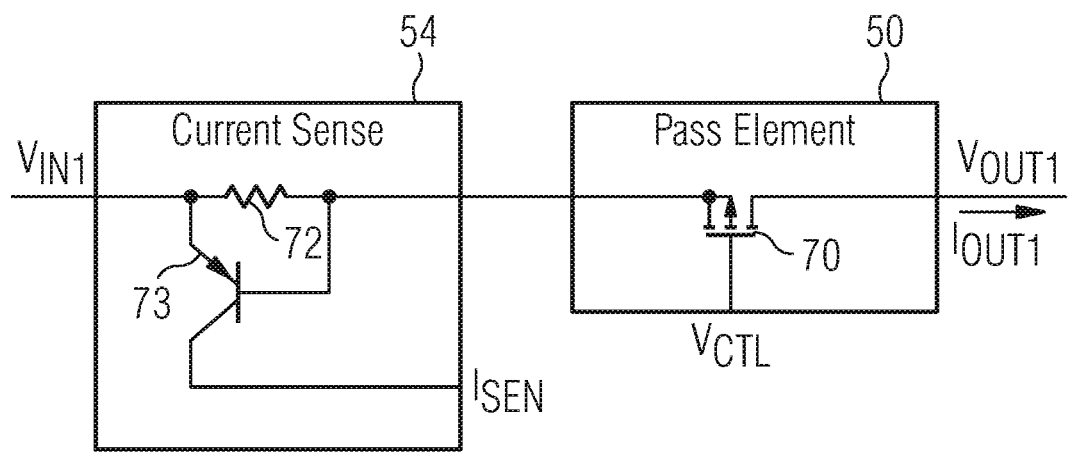
FIG. 5 is a schematic diagram of an example current sense coupled to an example pass element.

FIG. 5 is a schematic diagram that illustrates an example current sense 54 in series with the first pass element 50 and including a resistor 72 and a V/I converter 73. In this case, the V/I converter 73 is realized with a PNP transistor, which converts the voltage drop across the resistor 72 to the measurement $I_{SEN}$.

In another example, the current $I_{OUT1}$ may be a pulsed current. For example, the power stage 24 may be configured to provide a pulse width modulated (PWM) output. In this case, the channel controller 22 may determine an average of the current $I_{OUT1}$, and generate a signal $I_{SENAVE}$ to represent the average of the current $I_{OUT1}$.

Figure 6:
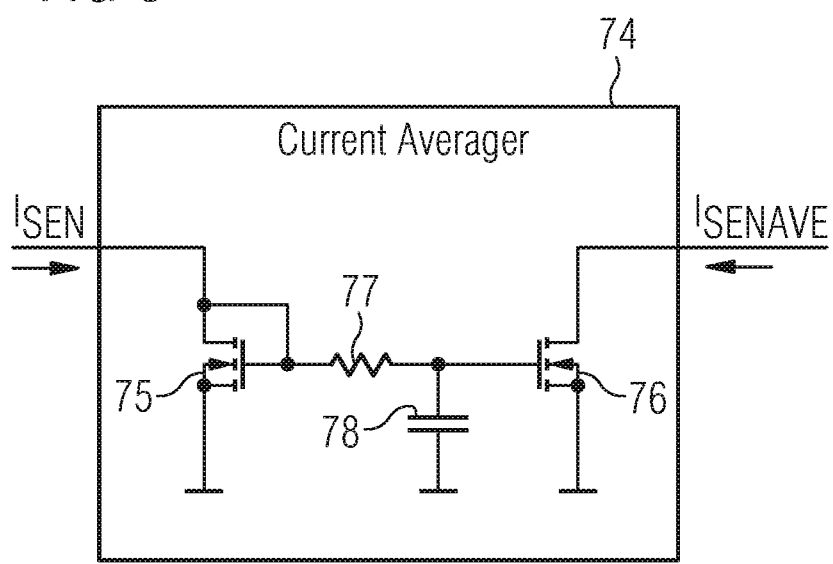
FIG. 6 is a schematic diagram of an example current averager.

FIG. 6 is a schematic diagram of an example current averager 74 that generates the signal $I_{SENAVE}$ to represent the average of the current $I_{OUT1}$. The example current averager 74 is a subcircuit, and includes a current mirror including first and second transistors 75, 76, and a low pass filter including a resistor 77 and a capacitor 78. The current averager 74 can be configured to receive, for example, a pulsed signal of the measurement $I_{SEN}$ as an input, and generate the signal $I_{SENAVE}$.

The channel controller 22 may include the current averager 74. In this case, the channel controller 22 may adjust the thermal shutdown threshold TSD based on the signal $I_{SENAVE}$. In some cases, the signal $I_{SENAVE}$ may need to be converted from a sink current to a source current by an additional current mirror.

In some cases, the power stage 24 may be configured to sink a current rather than source a current. That is, the current $I_{OUT1}$ may be a negative current flowing into the first pass element 50. The current sense 54 may be configured in this case to generate the measurement $I_{SEN}$ to indicate the level of the current $I_{OUT1}$ flowing into the first pass element 50. In still other cases, the power stage 24 may be a push-pull stage that both sources current and sinks current. In this case, as one example, both the source current and sink current may be independently sensed and each compared individually to respective current thresholds. The thermal shutdown threshold TSD may be adjusted based on a combination of the measured source and sink current components of $_{IOUT1}$ or on either one of the measured source and sink current components individually. For example, the thermal shutdown threshold TSD may be increased to the higher temperature level based on both the source current and sink current, as measured, remaining below their respective current thresholds.

Figure 7:
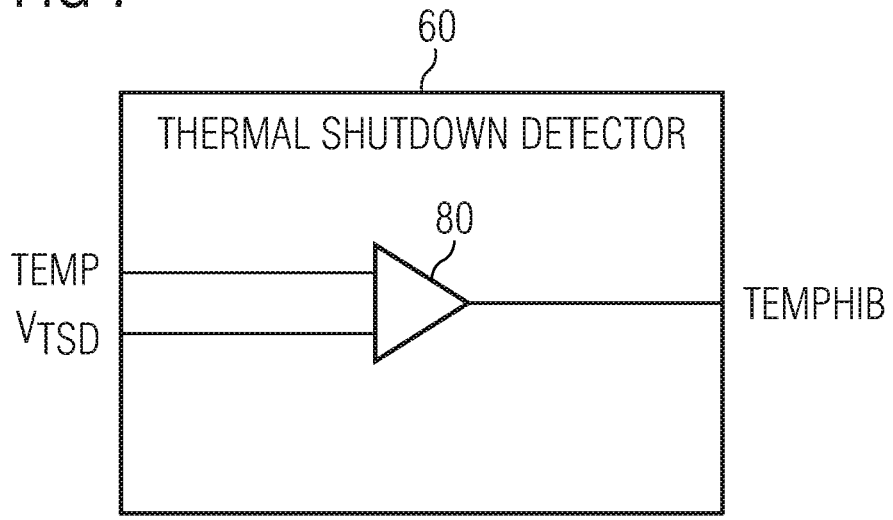
FIG. 7 is a schematic diagram of an example thermal shutdown detector.

As shown in FIG. 7, the thermal shutdown detector 60 may be a comparator 80 that receives the temperature measurement TEMP and the signal $V_{TSD}$ representing the thermal shutdown threshold TSD as inputs, compares the inputs TEMP, $V_{TSD}$ to each other and generates an output TEMPHIB based on the comparison. The comparator 80 generates TEMPHIB to be in a first state (for example, a logical low) in the case that the temperature measurement TEMP is greater than the signal $V_{TSD}$ representing the thermal shutdown threshold TSD and to be in a second state (for example a logical high) in the case the temperature measurement TEMP is less than or equal to the signal $V_{TSD}$ representing the thermal shutdown threshold TSD. In the case that TEMPHIB indicates a thermal shutdown condition (TEMP greater than $V_{TSD}$), the channel controller 22 turns off the power stage 24.

Figure 8:
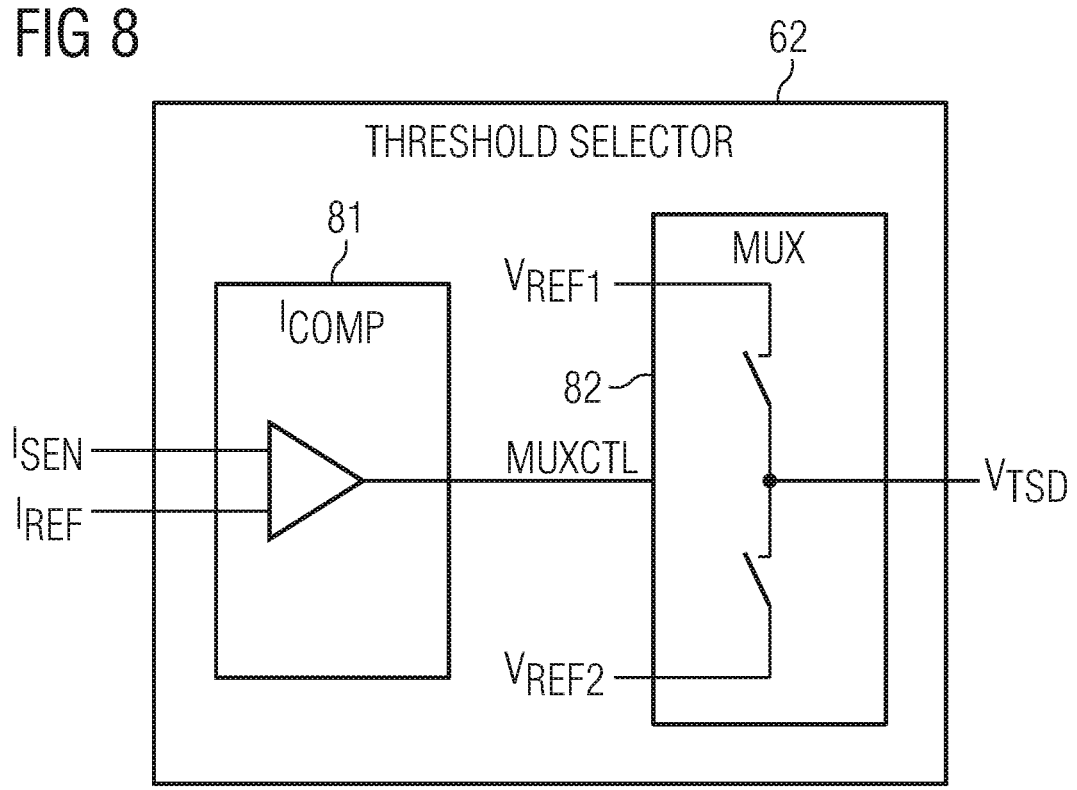
FIG. 8 is a block diagram of an example threshold selector for adjusting the thermal shutdown threshold based on the current level.

FIG. 8 is a schematic diagram of an example threshold selector 62. In this example, the threshold selector 62 includes a current comparator 81 and a multiplexer (mux) 82. The current comparator 81 receives as inputs the measurement $I_{SEN}$ and the predetermined current threshold $I_{REF}$ and generates a signal MUXCTL. The current comparator 81 generates the signal MUXCTL to be in a first state (for example, a logical high) in the case that the measurement $I_{SEN}$ is greater than the predetermined current threshold $I_{REF}$ and to be in a second state (for example a logical low) in the case the measurement $I_{SEN}$ is less than or equal to the predetermined current threshold $I_{REF}$.

The multiplexer (mux) 82 receives $V_{REF1}$ as a first input, $V_{REF2}$ as a second input, and the signal MUXCTL on a control input. $V_{REF1}$ may be a voltage representing the first temperature level, and $V_{REF2}$ may be a voltage representing the second temperature level. Multiplexer (mux) 82 may be configured, for example, to switch $V_{REF1}$ to the output signal $V_{TSD}$ for the signal MUXCTL in the first state and $V_{REF2}$ to the output signal $V_{TSD}$ for the signal MUXCTL in the second state.

The example threshold selector 62 as shown in FIG. 8 is only one example realization of a subcircuit to select the threshold for the thermal shutdown detector 60. Many alternative realizations are possible. As one further example, the output signal $V_{TSD}$ may be generated as a voltage drop across a resistor. The signal MUXCTL may switch a current through the resistor from a first level to a second level.

Figure 9:
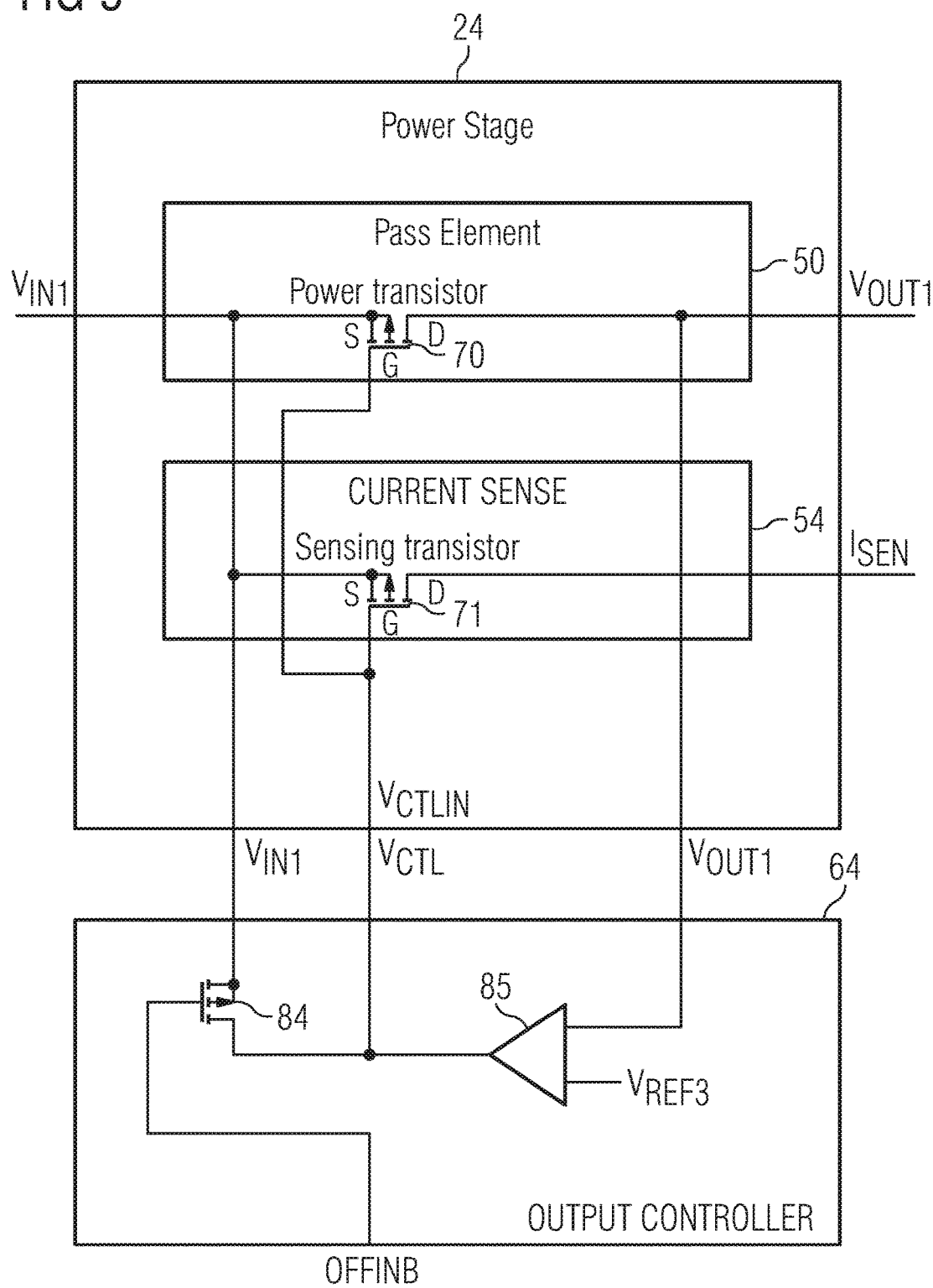
FIG. 9 is a schematic diagram of an example output controller coupled to an example power stage.

FIG. 9 is a schematic diagram of an example output controller 64 coupled to an example power stage 24.

In this example, the output controller 64 is configured to generate the control signal $V_{CTL}$ to regulate the voltage at the second node $V_{OUT1}$ coupled to an output of the power stage 24 to a specific range when the power stage 24 is activated. Upon receiving a signal indicating that a thermal shutdown condition is detected (in this case, OFFINB going to a low state), the output controller 64 forces the control signal $V_{CTL}$ to a high state, effectively turning the power stage 24 off.

The example output controller 64 of FIG. 9 includes a p-channel transistor 84 and an operational amplifier 85. The operational amplifier 85 receives a reference voltage $V_{REF3}$ as an input. When the power stage 24 is activated, the p-channel transistor 84 is turned off. The operational amplifier 85 regulates the voltage at the second node $V_{OUT1}$ to a specific range. The reference voltage $V_{REF3}$ can be, for example, a reference voltage based on a bandgap, or other reference voltage. In the case that OFFINB goes to a low state, the p-channel transistor 84 turns on, switching the control signal $V_{CTL}$ to a high state and turning power transistor 70 off.

Figure 10:
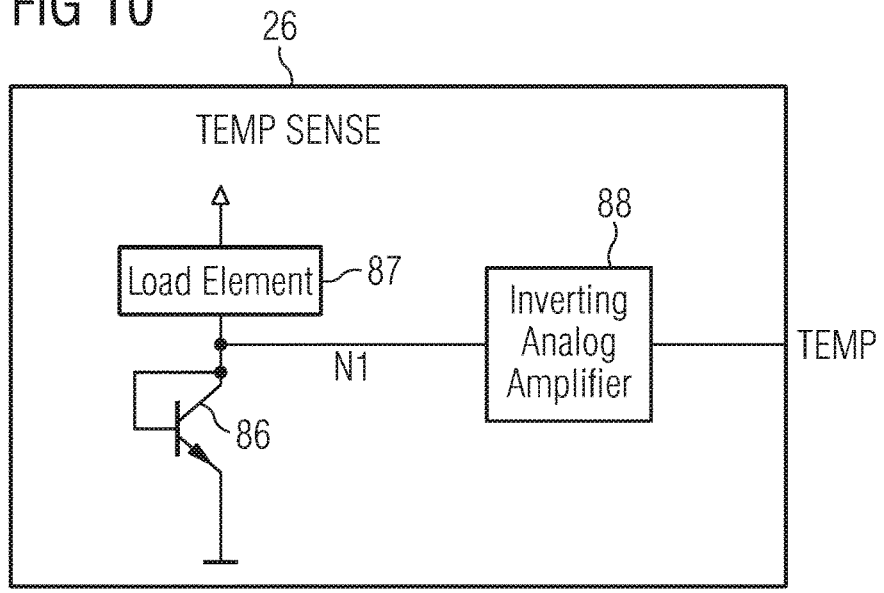
FIG. 10 is a schematic diagram of an example temperature sensor.

An example first temperature sensor 26 is shown in FIG. 10. The example first temperature sensor 26 generates the temperature measurement TEMP that indicates the temperature at the location of the first temperature sensor 26.

The example first temperature sensor 26 includes an NPN transistor 86 with the emitter coupled to ground and the collector and base coupled to a node N1. A load element 87 is coupled between a positive supply and the node N1. The load element 87 may be realized, for example, as a resistor or a current source. The node N1 is coupled to an input of an inverting amplifier 88. The inverting amplifier 88 inverts and amplifies the signal on the node N1 to generate the signal TEMP. In this case, the temperature measurement TEMP increases with increasing temperature sensed by the first temperature sensor 26.

Figure 11:
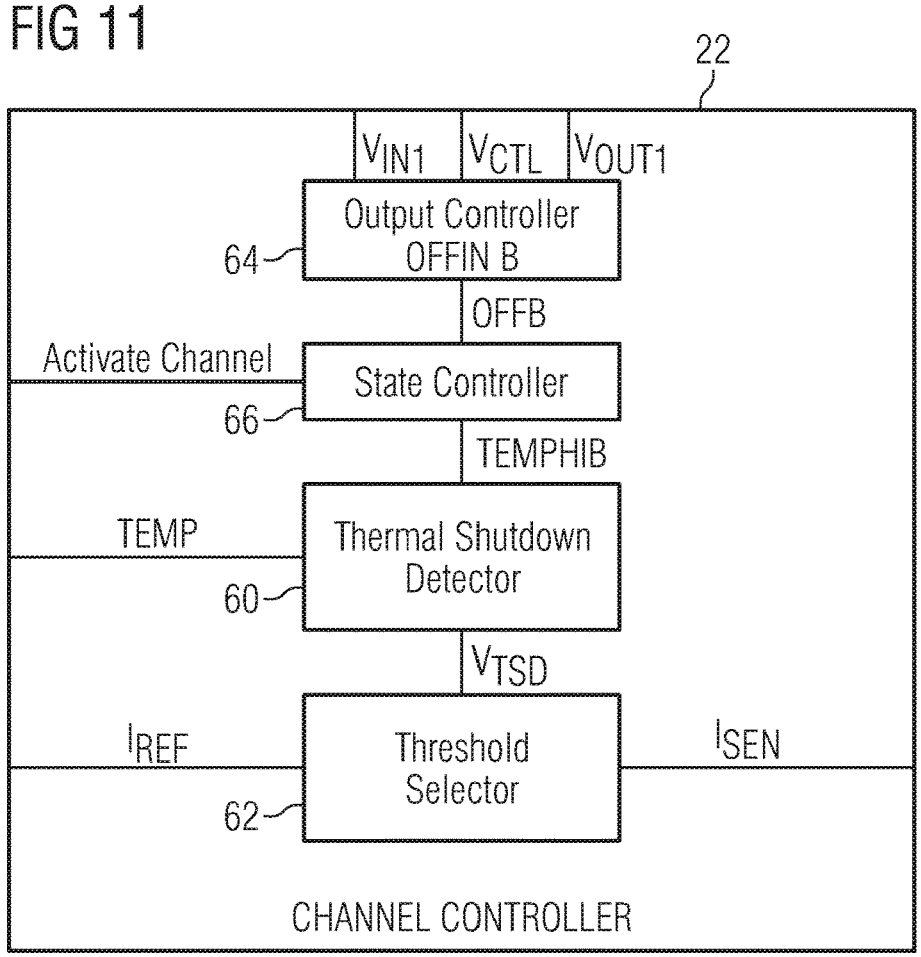
FIG. 11 is a block diagram of an example channel controller.

FIG. 11 illustrates another example of the channel controller 22 for the first channel 20. In this example, the channel controller 22 includes the thermal shutdown detector 60, threshold selector 62 and the output controller 64, as described above. Additionally, the channel controller 22 includes a state controller 66. The state controller 66 is configured to control states of the first channel 20 such as turning the first channel on, setting the thermal shutdown threshold TSD to a first level, setting the thermal shutdown threshold TSD to a second level, turning the first channel 20 off due to the thermal shutdown condition, etc. The state controller 66 may include digital logic circuits and/or a processor and may be programmed to switch the first channel 20 between states based on operating conditions and system or user inputs.

Figure 12A:
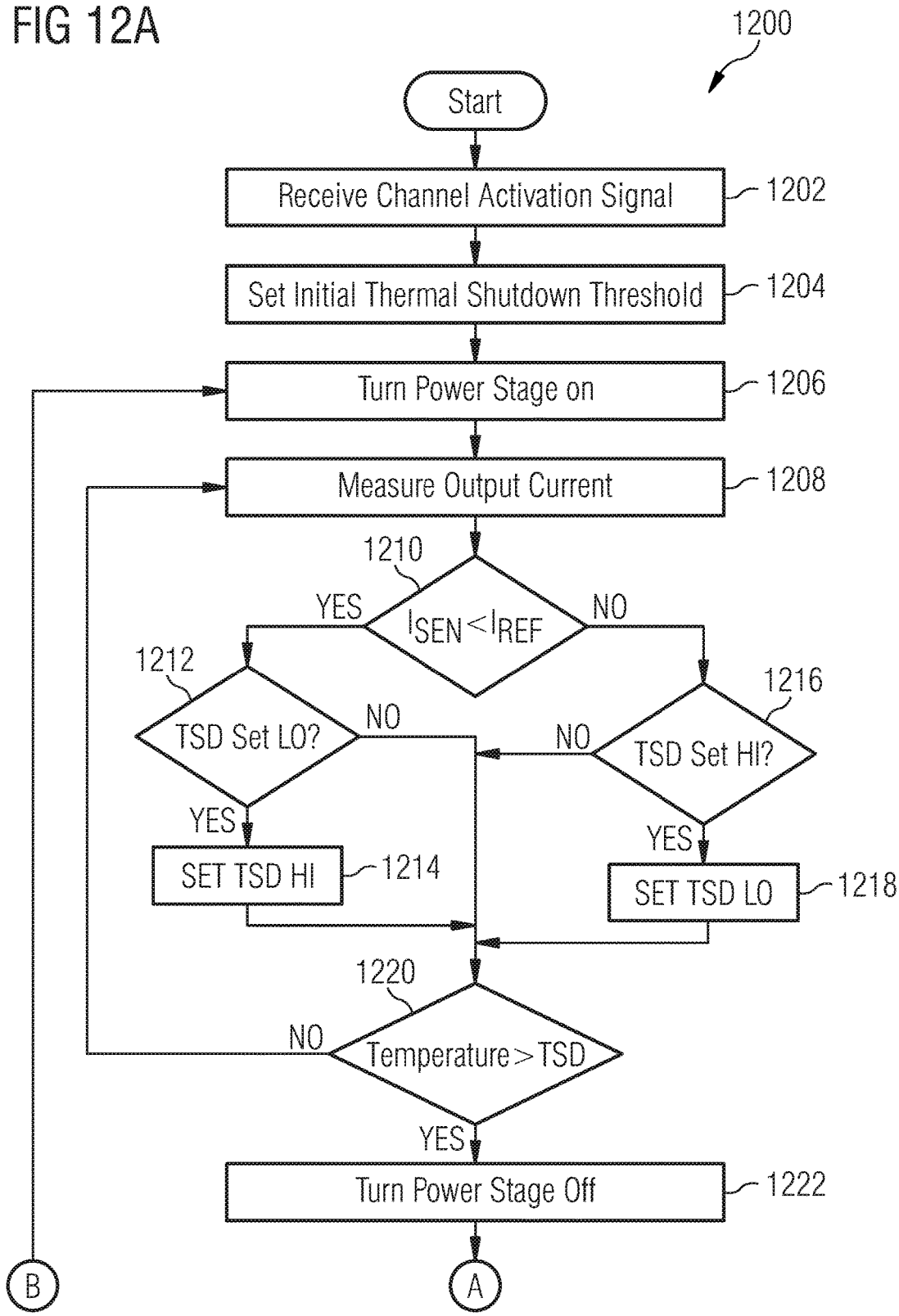
FIG. 12A is a first portion of a diagram of an example process for implementing a current dependent thermal shutdown.
Figure 12B:
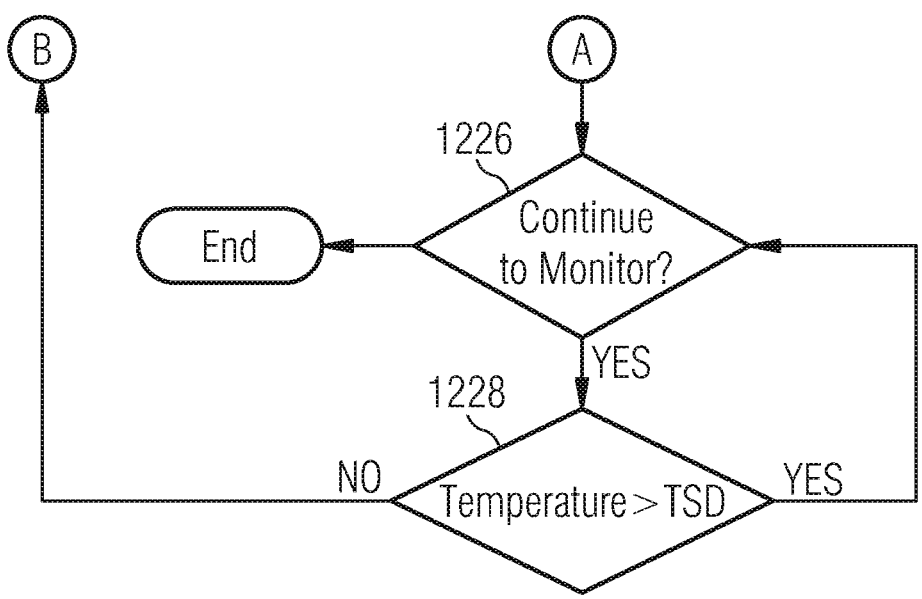
FIG. 12B is a second portion of the diagram of FIG. 12A.

FIGS. 12A and 12B are a block diagram of an example process 1200 for implementing a current dependent thermal shutdown that may be executed by the channel controller 22 in the first channel 20 of the device 10. As noted above, the channel controller 22 may include the state controller 66. The process 1200 starts in a block 1202.

In the block 1202, the channel controller 22 receives an input signal requesting that the first channel 20 be activated. For example, the channel controller 22 may receive an input from a user, or from a system including the first channel 20. Upon receiving the activation signal, process 1200 continues in a block 1204.

In the block 1204, the channel controller 22 sets a thermal shutdown threshold TSD to be a first temperature threshold. The first temperature threshold may be one of a low level or a high level depending on system requirements. The low level may be a level that protects the first channel 20 from exceeding a specified thermal limit due to self-heating. The high level may be higher than the low level, to reduce the likelihood that the first channel 20 will turn off due to heating from a second channel 30. Upon setting the thermal shutdown threshold TSD to be the first temperature threshold, the process 1200 continues in a block 1206.

In the block 1206, the channel controller 22 turns on the first pass element 50 in the power stage 24. The first pass element 50 begins to supply the current $I_{OUT1}$ to the load device 28. The process 1200 then continues in a block 1208.

In the block 1208, the current sense 54 in the first channel 20 measures the current $I_{OUT1}$ as described above. The current sense 54 provides the measurement $I_{SEN}$ to the channel controller 22. The measurement $I_{SEN}$ indicates the level of the current $I_{OUT1}$. The process 1200 then continues in a block 1210.

In the block 1210, the channel controller 22 determines whether the measurement $I_{SEN}$ is less than the predetermined current level $I_{REF}$. In the case that the measurement $I_{SEN}$ is less than the predetermined current level $I_{REF}$, the process 1200 continues in a block 1212. Otherwise, the process 1200 continues in a block 1216.

In the block 1212, the channel controller 22 determines whether the thermal shutdown threshold TSD is set to the low level. In the case that the thermal shutdown threshold TSD is set to the low level, the process 1200 continues in a block 1214. Otherwise, the process 1200 continues in a block 1220.

In the block 1214, the channel controller 22 switches the thermal shutdown threshold TSD to a second temperature threshold, wherein the second temperature threshold is the high level. Process 1200 then continues in the block 1220.

In the block 1216, which follows the block 1210, the channel controller 22 determines whether the thermal shutdown threshold TSD is set to the high level. In the case that the thermal shutdown threshold TSD is set to the high level, the process 1200 continues in a block 1218. Otherwise, the process 1200 continues in a block 1220.

In the block 1218, the channel controller 22 switches the thermal shutdown threshold TSD to the second temperature threshold, wherein the second temperature threshold is the low level. The process 1200 continues in a block 1220.

In the block 1220, the channel controller 22 determines whether the temperature of the power stage 24 in the first channel 20 is greater than the thermal shutdown threshold TSD. In the case that the temperature of the power stage 24 is greater than the thermal shutdown threshold TSD, the process 1200 continues in a block 1222. Otherwise, the process 1200 continues in the block 1208.

In the block 1222, the channel controller 22 turns the power stage 24 off. Upon turning off the power stage 24, the process 1200 continues in a block 1226.

In the block 1226, the channel controller 22 determines whether the channel controller 22 should continue to monitor the first channel 20. For example, the channel controller 22 may be programmed to continue to monitor the temperature of the power stage 24, so long as the activation signal is present. Upon determining that the activation signal is still present, the process 1200 continues in a block 1228. In the case that the activation signal is no longer present, the process 1200 ends.

In the block 1228, the channel controller 22 determines whether the temperature of the power stage 24 is greater than the thermal shutdown threshold TSD. In the case that the temperature of the power stage 24 is greater than the thermal shutdown threshold TSD, the process 1200 continues in a block 1226, and continues to monitor the temperature of the power stage 24. The case that the temperature of the output stage 24 is no longer greater than the thermal shutdown threshold TSD indicates that the temperature of the power stage 24 has dropped below the thermal shutdown threshold TSD. In this case the power stage 24 can be turned back on. The process continues in the block 1206.

As an alternative to selecting the thermal shutdown threshold TSD based on the current through the first pass element 50, the thermal shutdown threshold TSD may be determined based on an estimated power dissipation of the first pass element 50. The channel controller 122 in the first channel 120 may be configured to estimate the power dissipation of the first pass element 50, and based on the estimated power dissipation, select the thermal shutdown threshold TSD.

In this case, in addition to receiving the measurement $I_{SEN}$, the channel controller 122 is configured to receive a signal $V_{SEN}$ indicating a voltage drop across the first pass element 50. The channel controller 122 may then estimate the power by determining a product of the current through the first pass element 50 and the voltage drop across the first pass element 50. As described in additional detail below with reference to FIGS. 13-15, the channel controller 122 in the first channel 120 may utilize digital and/or analog approaches to estimating the power dissipation. The channel controller 122 is then configured to select the thermal shutdown threshold TSD based on both of the measurement $I_{SEN}$ and the signal $V_{SEN}$.

Figure 13:
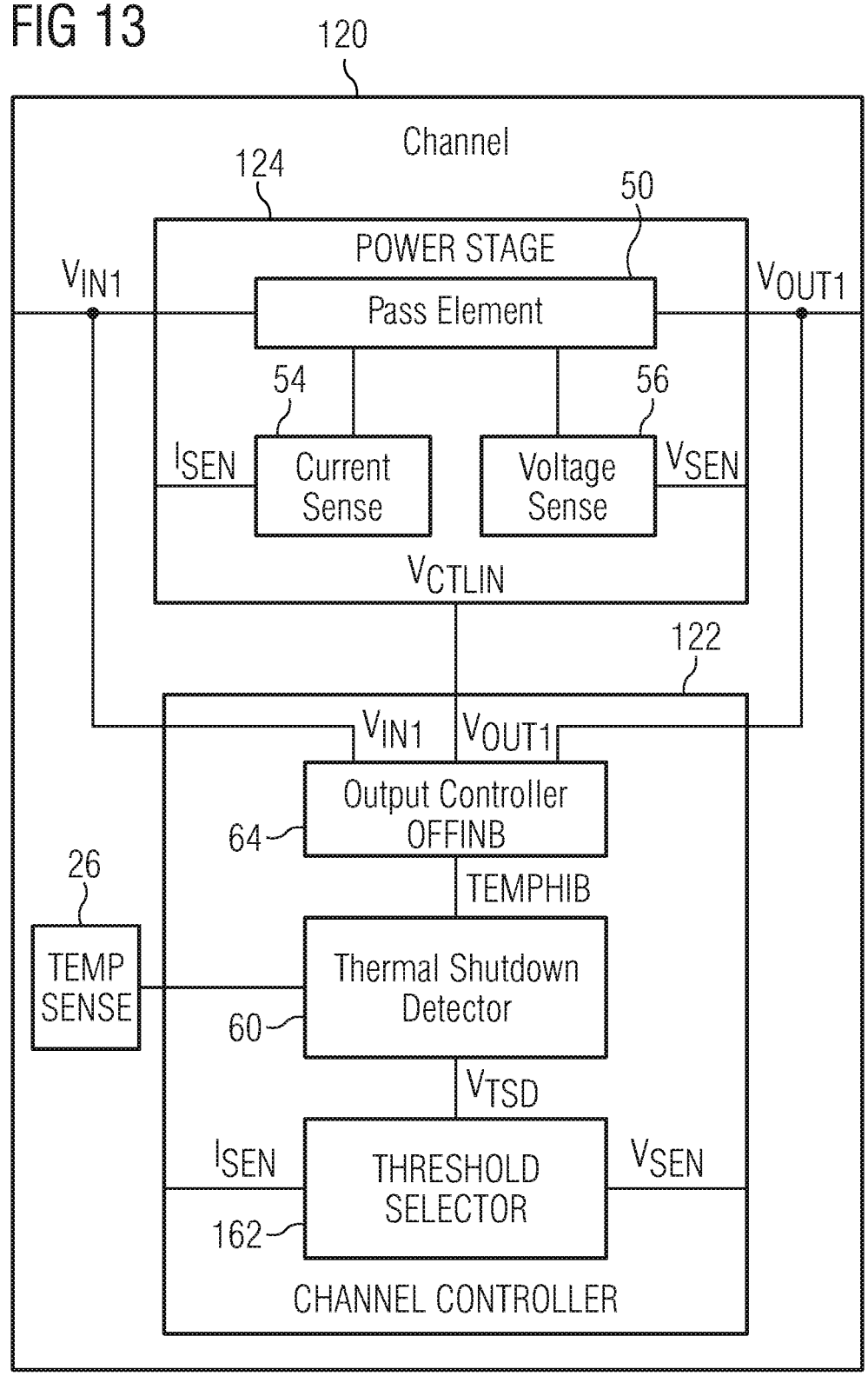
FIG. 13 is a block diagram of a second example channel that adjusts the thermal shutdown threshold based on an estimated power level.

FIG. 13 illustrates an example first channel 120 that is configured to select the thermal shutdown threshold TSD based on the estimated power dissipation of the first pass element 50. The first channel 120 includes the power stage 124 and the channel controller 122. The power stage 124 includes, in addition to the first pass element 50 and the current sense 54, a voltage sense 56.

The voltage sense 56 is a subcircuit configured to measure a voltage indicating the voltage drop across the first pass element 50. Based on the measurement, the voltage sense 56 generates the signal $V_{SEN}$. In some cases, the voltage sense 56 may measure the voltage drop across the first pass element 50 directly. In other cases, for example when the voltage on the first node $V_{IN1}$ coupled to the input of the first pass element 50 is known, the voltage sense 56 may measure a voltage on the second node $V_{OUT1}$ coupled to the output of the first pass element 50. In this case, the voltage drop across the first pass element 50 may be estimated by determining the difference between the voltage on the first node $V_{IN1}$ and the measured voltage on the second node $V_{OUT1}$.

In this example, the channel controller 122 includes the thermal shutdown detector 60, the output controller 64, and a threshold selector 162. As in previous examples, the thermal shutdown detector 60 determines whether the temperature measurement TEMP exceeds the signal $V_{TSD}$ representing the thermal shutdown threshold TSD. In the case that the thermal shutdown detector 60 determines that the temperature measurement TEMP exceeds the signal $V_{TSD}$, the thermal shutdown detector 60 outputs the signal TEMPHIB to the output controller 64 and instructs the output controller 64 to turn off the power stage 124. The output controller 64 then turns the power stage 124 off.

The threshold selector 162 in this example receives both the measurement $I_{SEN}$ and the signal $V_{SEN}$ as inputs. The threshold selector 162 estimates the power dissipation of the first pass element 50 based on the measurement $I_{SEN}$ and the signal $V_{SEN}$. Based on the estimated power, the threshold selector 162 generates the signal $V_{TSD}$ representing the thermal shutdown threshold TSD.

For example, a power threshold due to self-heating may be set based on a maximum power that the first pass element 50 can dissipate without triggering a thermal shutdown due to self-heating. In this case, the power threshold can be calculated as $$P_{THRESHOLD} = \frac{TL_{SH} - T_{AMBMAX}}{R_{th}} \qquad \text{Eqn. 2}$$

where $P_{THRESHOLD}$ is a power threshold, $TL_{SH}$ is a specified temperature limit for the device due to self-heating, $T_{AMBMAX}$ is the maximum ambient operating temperature, and $R_{TH}$ is the thermal resistance of the package.

In the case that the power dissipation is greater than the power threshold $P_{THRESHOLD}$, the threshold selector 162 may select the first temperature level for the thermal shutdown threshold TSD. In the case that the power dissipation is less than or equal to the power threshold $P_{THRESHOLD}$, the threshold selector 162 may select the second temperature level for the thermal shutdown threshold TSD.

In a typical case, the second temperature level may be selected to be higher than the first temperature level, such that, when the first channel 120 is operating at a power level below the power threshold $P_{THRESHOLD}$, the probability of thermal shutdown due to temperature gradients from neighboring second channels 30 is reduced. Conversely, the first temperature level may be selected to be at a lower level to protect the first channel 120 from exceeding a specified thermal limit due to self-heating.

As noted above, in some cases, the voltage on the first node $V_{IN1}$ coupled to the input of the first pass element 50 may be known. In these cases, the voltage sense 56 may generate the signal $V_{SEN}$ based on the measurement of the voltage at the output of the first pass element 50.

Figure 14:
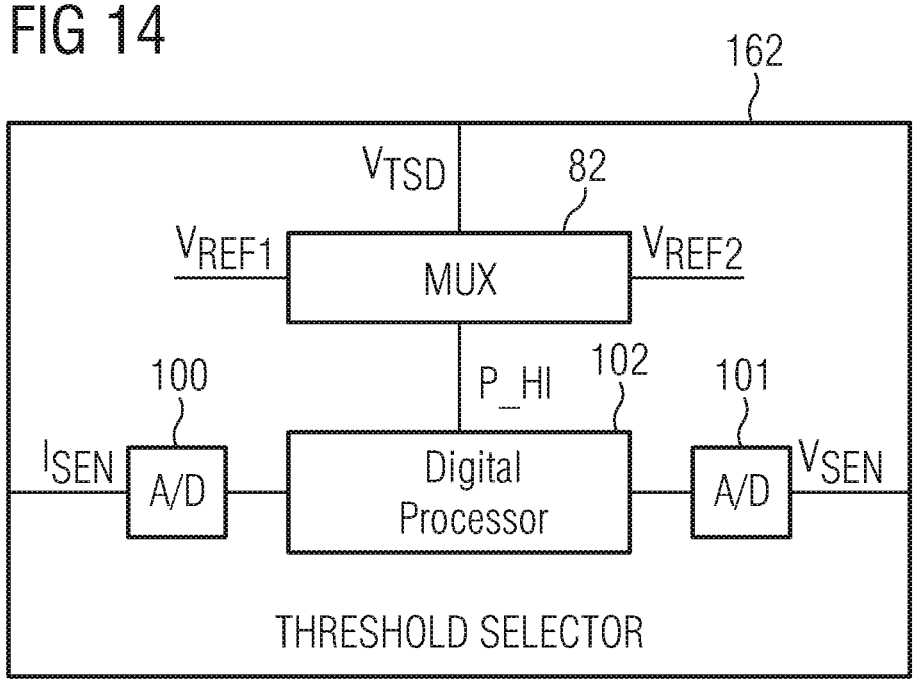
FIG. 14 is a block diagram of an example threshold selector for selecting the thermal shutdown threshold based on the estimated power level.

FIG. 14 is a block diagram of an example threshold selector 162. In this example, the channel controller 122 utilizes a digital approach to estimating the power dissipated by the first pass element 50 based on the measurement $I_{SEN}$ and the signal $V_{SEN}$. The threshold selector 162 includes a multiplexer (mux) 82, first and second analog to digital (A/D) converters 100, 101, and a digital processor 102. The threshold selector 162 receives the measurement of the current $I_{SEN}$ and the signal $V_{SEN}$ as inputs and outputs the signal $V_{TSD}$ representing the thermal shutdown threshold TSD. Note that in this case, one or both of the measurement $I_{SEN}$ and signal $V_{SEN}$ may need to be converted to voltages prior to A/D conversion.

In this example, each of the measurement $I_{SEN}$ and signal $V_{SEN}$ may be analog signals. The first and second A/D converters 100, 101 may convert respectively the measurement $I_{SEN}$ and the signal $V_{SEN}$ of the voltage drop to digital values. The digital processor 102 may calculate the estimated power dissipation of the first pass element 50. As one example, the digital processor 102 may calculate a product of the current through the first pass element 50 and the voltage drop across the first pass element 50. As another example, the digital processor 102 may include a table of power dissipation values, and select a value from the table based on the measurement $I_{SEN}$ and the signal $V_{SEN}$.

Upon estimating the power dissipation of the first pass element 50, the digital processor 102 may further compare the estimated power dissipation of the first pass element 50 with the power threshold $P_{THRESHOLD}$. Based on the comparison, the digital processor 102 may control the multiplexer (mux) 82 to select the signal $V_{TSD}$ representing the thermal shutdown threshold TSD to output to the thermal shutdown detector 60.

Figure 15:
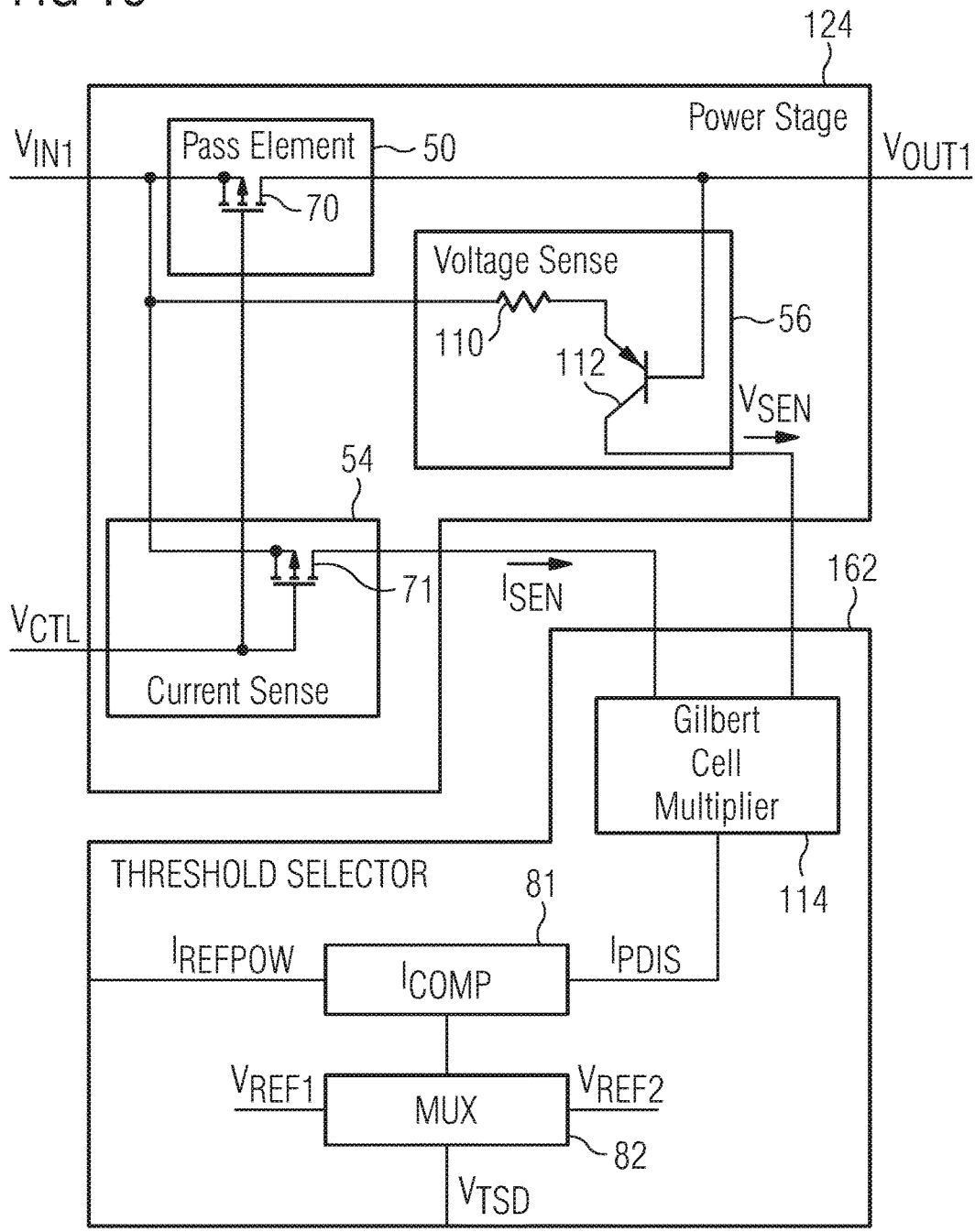
FIG. 15 is a block diagram of an example power stage coupled to an example threshold selector for selecting the thermal shutdown threshold based on the estimated power level.

FIG. 15 is a block diagram of an example power stage 124 coupled to an example threshold selector 162 for selecting a thermal shutdown threshold TSD based on the estimated power level. In this example, the threshold selector 162 utilizes an analog approach to estimating the power dissipation of the first pass element 50. The threshold selector 162 receives the measurement $I_{SEN}$ and the signal $V_{SEN}$ indicating the voltage across the first pass element 50. The threshold selector 162 then estimates the power dissipation of the first pass element 50 by determining the product of the measurement $I_{SEN}$ and the signal $V_{SEN}$.

The power stage 124 includes the first pass element 50 and the current sense 54 as described above. Additionally, the power stage 124 includes the voltage sense 56 configured to generate the signal $V_{SEN}$. The signal $V_{SEN}$ in this case is a current indicating the voltage across the first pass element 50.

The threshold selector 162 includes the current comparator 81 and multiplexer (mux) 82 as described above. Additionally, the threshold selector 162 includes a Gilbert cell multiplier 114. The Gilbert cell multiplier 114 receives the measurement $I_{SEN}$ and the signal $V_{SEN}$ as inputs and generates $I_{PDIS}$ as an output. $I_{PDIS}$ is a current representing the product of the measurement $I_{SEN}$ and the signal $V_{SEN}$. Accordingly, $I_{PDIS}$ represents the estimated power dissipation of the first pass element 50.

The threshold selector 162 then compares, for example using the current comparator 81, $I_{PDIS}$ with a predetermined reference current $I_{REFpow}$. The predetermined reference current $I_{REFpow}$ can be selected based on, for example, the maximum power dissipation for which the first channel 120 will not exceed a specified thermal limit due to self-heating, or another limit to protect the first channel 120.

In another example device 10, a first channel may include a thermal shutdown threshold TSD incorporating multiple temperature levels. Each of the multiple temperature levels may be selected, for example, based on a respective current level through the power stage 24 or a respective power dissipation of the power stage 24 associated with the first channel.

As described above, the device 10 may include multiple first channels 20, 120 including respective power stages 24, 124 and multiple second channels 30 each including respective power stages 34. One or more of the first channels 20, 120 may include a thermal shutdown threshold TSD to turn off the respective power stage 24, 124 in the case that a temperature of the power stage rises above a thermal shutdown threshold TSD. The thermal shutdown threshold TSD may be set at the first temperature level in the case that the current through the power stage 24, 124 or the power dissipated by the power stage 124 is above a threshold level. The first temperature level may be the thermal shutdown threshold TSD for protection against self-heating for the first channel 20, 120. The thermal shutdown threshold TSD may be set to the second temperature level in the case that the current through the power stage 24, 124 or the power dissipated by the power stage 124 is below the threshold level. The second temperature level may be higher than the first temperature level, to reduce the likelihood that the first channel 20, 120 will be shut off due to heat from a neighboring second channel 30.

Further embodiments relate to the following examples:

1. A device 10 comprising: a first pass element 50; and a controller 22, 122 configured to receive a measurement of a current through the first pass element 50; select, based on the measurement of the current, a thermal shutdown threshold; and turn off the first pass element 50 based on a determination that a first temperature of the first pass element 50 is greater than the thermal shutdown threshold.

2. The device 10 according to example 1, further comprising: a substrate 12, with the first pass element 50 on the substrate 12; and a first temperature sensor 26 on the substrate 12 arranged to output a measurement of the first temperature to the controller 22, 122 wherein the determination that the first temperature is greater than the thermal shutdown threshold is based on the measurement of the first temperature.

3. The device 10 according to example 1 or 2, wherein the controller 22, 122 is configured to select the thermal shutdown threshold from a first temperature level in case the measurement of the current through the first pass element 50 is greater than or equal to a predetermined current threshold, and a second temperature level in case the measurement of the current through the first pass element 50 is less than the predetermined current threshold.

4. The device 10 according to example 3, wherein the predetermined current threshold is based on a maximum allowable current for which the first pass element 50 can heat to a second temperature greater than or equal to a specified thermal limit due to self-heating.

5. The device 10 according to example 3, wherein the first temperature level is lower than the second temperature level.

6. The device 10 according to example 3, further comprising: a second pass element 51 on the substrate 12; and a second temperature sensor 36 on the substrate 12, wherein a difference between the first temperature level and the second temperature level is based on a specified maximum mismatch error between the first and second temperature sensors 26, 36.

7. The device according to example 6, wherein the first temperature sensor 26 is within a first predetermined distance of the first pass element 50, and the second temperature sensor is within a second predetermined distance of the second pass element 51.

8. The device 10 according to examples 1 or 2, wherein the controller 122 is further configured to receive an indication of a voltage drop across the first pass element 50 and to select the thermal shutdown threshold based further on the indication of the voltage drop across the first pass element 50.

9. The device 10 according to example 8, wherein the controller 122 is further configured to: estimate a power dissipation of the first pass element 50 based on the measurement of the current through the first pass element 50 and the indication of the voltage drop across the first pass element 50; and select the thermal shutdown threshold based on the estimate of the power dissipation of the first pass element 50.

10. The device 10 according to example 8, wherein the indication of the voltage drop across the first pass element 50 comprises a measurement of a voltage at an output of the first pass element 50; and wherein the device further comprises a voltage sense subcircuit 56 configured to measure the voltage at the output of the first pass element 50 and output the measurement of the voltage to the controller 122.

11. The device 10 according to examples 1 or 2, further comprising: a current sense subcircuit 54 configured to measure the current through the first pass element 50 and output the measurement of the current to the controller 22, 122.

12. The device 10 according to example 11, wherein the first pass element 50 comprises a power transistor 70 comprising a drain, a gate and a source, and the current sense subcircuit 54 comprises a sensing transistor 71 comprising a drain, a gate and a source, the drain of the power transistor 70 coupled to the drain of the sensing transistor 71, the gate of the power transistor 70 coupled to the gate of the sensing transistor 71, the source of the power transistor 70 configured to output the current through the first pass element 50 and the source of the sensing transistor 71 configured to output the measurement of the current through the first pass element 50.

13. The device 10 according to example 11, wherein the current sense subcircuit 54 includes a resistor 72 in series with the first pass element 50.

14. The device 10 according to examples 1 or 2, wherein the current through the first pass element 50 is pulsed, and the measurement of the current represents an average of the current.

15. The device 10 according to examples 1 or 2, wherein the current through the first pass element 50 is one of a positive current flowing out of the first pass element 50 and a negative current flowing into the first pass element 50.

16. A device 10 comprising: a pass element 50; a controller 22, 122 arranged to receive a measurement of a current through the pass element 50, the controller 22, 122 comprising: means for selecting, based on the measurement of the current, a thermal shutdown threshold; and means for turning off the pass element 50 based on a determination that a temperature of the pass element 50 is greater than the thermal shutdown threshold.

17. The device 10 according to example 16, further comprising: a substrate 12, with the pass element 50 on the substrate 12; and a first temperature sensor 26 on the substrate 12 arranged to output a measurement of the temperature to the controller 22, 122, wherein the determination that the first temperature is greater than the thermal shutdown threshold is based on the measurement of the temperature.

18. The device 10 according to example 16 or 17, wherein the controller 22, 122 further comprises: means for selecting the thermal shutdown threshold from a first temperature level in case the measurement of the current through the pass element 50 is greater than or equal to a predetermined current threshold, and a second temperature level in case the measurement of the current through the pass element 50 is less than the predetermined current threshold.

19. A method comprising: turning on a pass element 50; selecting a thermal shutdown threshold to turn off the pass element 50 at a first temperature threshold; measuring a current through the pass element 50; and switching the thermal shutdown threshold to a second temperature threshold, based on the measurement of the current through the pass element 50.

20. The method of claim 19, wherein the first temperature threshold is higher than the second temperature threshold, further comprising: determining, based on the measurement of the current through the pass element 50, that the current is greater than or equal to a current threshold; and switching the thermal shutdown threshold to the second temperature threshold based on the determination.

21. The method of claim 20, further comprising: determining, based on a measurement of a temperature from a temperature sensor 26, that the temperature is greater than or equal to the thermal shutdown threshold; and turning off the pass element 50.

22. The method of claim 19, wherein the first temperature threshold is lower than the second temperature threshold, further comprising: switching the thermal shutdown threshold to the second temperature threshold based on a determination that the current through the pass element 50 is less than a current threshold.

The circuits and subcircuits described herein, unless otherwise indicated, are only examples. Other realizations of the functions of these circuits and subcircuits are understood to be included within the scope of this disclosure.

The terms "first" and "second" are used as identifiers, and do not signify order or importance.

As used herein, the adverb "substantially" means that a shape, structure, measurement, quantity, time, etc. may deviate from an exact described geometry, distance, measurement, quantity, time, etc., because of imperfections in materials, machining, manufacturing, etc.

The term "example" is used herein in the sense of signifying an example, e.g., a reference to an "example widget" should be read as simply referring to an example of a widget.

Computer-executable instructions may be compiled or interpreted from computer programs created using a variety of programming languages and/or technologies, including, without limitation, and either alone or in combination, Java™, C, C++, Python, Visual Basic, Java Script, Perl, HTML, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media. A file in a networked device is generally a collection of data stored on a computer readable medium, such as a storage medium, a random access memory, etc.

A computer-readable medium includes any medium that participates in providing data (e.g., instructions), which may be read by a computer. Such a medium may take many forms, including, but not limited to, non-volatile media, volatile media, etc. Non-volatile media include, for example, optical or magnetic disks and other persistent memory. Volatile media include dynamic random access memory (DRAM), which typically constitutes a main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with rules of holes, a RAM, a PROM, an EPROM, a FLASH-EEPROM, any other memory chip or cartridge, or any other medium from which a computer can read.

In the drawings, the same reference numbers indicate the same elements. Further, some or all of these elements could be changed. With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims. All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A device comprising:
a first pass element; and
a controller configured to:
receive a measurement of a current through the first pass element;
select, based on the measurement of the current, a thermal shutdown threshold; and
turn off the first pass element based on a determination that a first temperature of the first pass element is greater than the thermal shutdown threshold.

2. The device of claim 1, further comprising:
a substrate having the first pass element arranged thereon; and
a first temperature sensor arranged on the substrate and configured to output a measurement of the first temperature to the controller, wherein the determination that the first temperature is greater than the thermal shutdown threshold is based on the measurement of the first temperature.

3. The device of claim 2, wherein the controller is configured to select the thermal shutdown threshold from a first temperature level in case the measurement of the current through the first pass element is greater than or equal to a predetermined current threshold, and a second temperature level in case the measurement of the current through the first pass element is less than the predetermined current threshold.

4. The device of claim 3, wherein the predetermined current threshold is based on a maximum allowable current for which the first pass element can heat to a second temperature greater than or equal to a specified thermal limit due to self-heating.

5. The device of claim 3, wherein the first temperature level is lower than the second temperature level.

6. The device of claim 3, further comprising:
a second pass element arranged on the substrate; and
a second temperature sensor arranged on the substrate, wherein a difference between the first temperature level and the second temperature level is based on a specified maximum mismatch error between the first and second temperature sensors.

7. The device of claim 6, wherein the first temperature sensor is arranged within a first predetermined distance of the first pass element, and the second temperature sensor is arranged within a second predetermined distance of the second pass element.

8. The device of claim 1, wherein the controller is further configured to receive an indication of a voltage drop across the first pass element and to select the thermal shutdown threshold based further on the indication of the voltage drop across the first pass element.

9. The device of claim 8, wherein the controller is further configured to:
estimate a power dissipation of the first pass element based on the measurement of the current through the first pass element and the indication of the voltage drop across the first pass element; and
select the thermal shutdown threshold based on the estimate of the power dissipation of the first pass element.

10. The device of claim 8, wherein the indication of the voltage drop across the first pass element comprises a measurement of a voltage at an output of the first pass element; and wherein the device further comprises a voltage sense subcircuit configured to measure the voltage at the output of the first pass element and output the measurement of the voltage to the controller.

11. The device of claim 1, further comprising:
a current sense subcircuit configured to measure the current through the first pass element and output the measurement of the current to the controller.

12. The device of claim 11, wherein the first pass element comprises a power transistor comprising a drain, a gate and a source, and the current sense subcircuit comprises a sensing transistor comprising a drain, a gate and a source, the source of the power transistor coupled to the source of the sensing transistor, the gate of the power transistor coupled to the gate of the sensing transistor, the drain of the power transistor configured to output the current through the first pass element and the drain of the sensing transistor configured to output the measurement of the current through the first pass element.

13. The device of claim 11, wherein the current sense subcircuit includes a resistor in series with the first pass element.

14. The device of claim 1, wherein the current through the first pass element is pulsed, and the measurement of the current represents an average of the current.

15. The device of claim 1, wherein the current through the first pass element is a positive current flowing out of the first pass element.

16. A device comprising:
a pass element;
a controller configured to receive a measurement of a current through the pass element, the controller comprising:
    means for selecting, based on the measurement of the current, a thermal shutdown threshold; and
    means for turning off the pass element based on a determination that a temperature of the pass element is greater than the thermal shutdown threshold.

17. The device of claim 16, further comprising:
a substrate having the pass element arranged thereon; and
a first temperature sensor arranged on the substrate and configured to output a measurement of the temperature to the controller, wherein the determination that the first temperature is greater than the thermal shutdown threshold is based on the measurement of the temperature.

18. The device of claim 17, wherein the controller further comprises:
    means for selecting the thermal shutdown threshold from a first temperature level in case the measurement of the current through the pass element is greater than or equal to a predetermined current threshold, and a second temperature level in case the measurement of the current through the pass element is less than the predetermined current threshold.

19. A method comprising:
turning on a pass element;
selecting a thermal shutdown threshold to turn off the pass element at a first temperature threshold;
measuring a current through the pass element; and
switching the thermal shutdown threshold to a second temperature threshold, based on the measurement of the current through the pass element.

20. The method of claim 19, wherein the first temperature threshold is higher than the second temperature threshold, the method further comprising:
determining, based on the measurement of the current through the pass element, that the current is greater than or equal to a current threshold; and
switching the thermal shutdown threshold to the second temperature threshold based on the determination.

21. The method of claim 20, further comprising:
determining, based on a measurement of a temperature from a temperature sensor, that the temperature is greater than or equal to the thermal shutdown threshold; and
turning off the pass element.

22. The method of claim 19, wherein the first temperature threshold is lower than the second temperature threshold, the method further comprising:
switching the thermal shutdown threshold to the second temperature threshold based on a determination that the current through the pass element is less than a current threshold.

* * * * *